United States Patent [19]
Blumer

[11] Patent Number: 6,166,821
[45] Date of Patent: Dec. 26, 2000

[54] SELF CALIBRATING PULSE WIDTH MODULATOR FOR USE IN ELECTROSTATIC PRINTING APPLICATIONS

[75] Inventor: Marc Blumer, Belmont, Calif.

[73] Assignee: Electronics for Imaging, Inc., Foster City, Calif.

[21] Appl. No.: 09/165,749

[22] Filed: Oct. 2, 1998

[51] Int. Cl.[7] ................................................. G06F 15/00
[52] U.S. Cl. .......................... 358/1.1; 358/1.2; 347/112; 347/116; 347/128; 347/143
[58] Field of Search .............................. 358/1.1, 1.2, 1.3, 358/1.4, 1.7, 1.8, 296, 298; 347/5, 10, 11, 112–117, 128–144; 399/128, 167

[56] References Cited

U.S. PATENT DOCUMENTS

| | | | |
|---|---|---|---|
| 4,569,266 | 2/1986 | Ando | 83/411 |
| 4,703,251 | 10/1987 | Baumgartner et al. | 324/617 |
| 4,905,022 | 2/1990 | Nagasawa | 346/108 |
| 4,914,459 | 4/1990 | Mama et al. | 346/160 |
| 4,998,257 | 3/1991 | On et al. | 372/38 |
| 5,081,631 | 1/1992 | Dhurjaty | 372/38 |
| 5,109,283 | 4/1992 | Carley | 358/298 |
| 5,122,883 | 6/1992 | Carley | 358/296 |
| 5,438,303 | 8/1995 | Murakami et al. | 332/109 |
| 5,493,410 | 2/1996 | Oikawa | 358/298 |

FOREIGN PATENT DOCUMENTS

| | | | |
|---|---|---|---|
| 0386741A2 | 9/1990 | European Pat. Off. | H04N 1/40 |
| 0438271A2 | 7/1991 | European Pat. Off. | H04N 1/46 |
| 479 537A2 | 4/1992 | European Pat. Off. | H04N 1/40 |
| 0564868A2 | 10/1993 | European Pat. Off. | H04N 1/40 |
| 0798918A1 | 10/1997 | European Pat. Off. | H04N 1/393 |
| 2 264 024 | 8/1993 | United Kingdom | H04N 1/40 |

OTHER PUBLICATIONS

Analog Device, *Pulse Width Modulator*, 1996, Analog Devices Manual.

*Primary Examiner*—Edward L. Coles
*Assistant Examiner*—Mark Wallerson
*Attorney, Agent, or Firm*—Michael A. Glenn

[57] ABSTRACT

An arrangement for producing a variable width pulse is disclosed for use in an electrostatic printing mechanism which is adapted to produce grayscale intensity of a pixel to be printed based on predetermined digital data. The variable width pulse is formed during a clock interval which is established by a clock signal such that the width of the pulse during the clock interval is based on the digital data and corresponds to a grayscale intensity of the pixel to be printed. The arrangement includes at least a first delay line including an input, an output and a plurality of cells serially connected therebetween such that a digital signal received by the input propagates from the input to the output through the cells. Each cell includes a cell output for indication of the present state of digital data contained in the cell. A pulse generating section then provides the clock signal, as the digital signal, to the input of the first delay line such that the clock signal propagates through the first delay line. Thereafter, a processing section reads the cell output of a first one of the cells at a first position on the first delay line and then reads the cell output of a second one of the cells at a second, subsequent position on the first delay line to form the variable width pulse width having a width defined as the propagation time of the clock signal from the first position to the second position on the first delay line.

32 Claims, 3 Drawing Sheets

SELF CALIBRATING PULSE WIDTH MODULATOR FOR USE IN ELECTROSTATIC PRINTING APPLICATIONS

BACKGROUND OF THE INVENTION

1. Technical Field

The invention relates generally to the field of printing using an electrostatic printing mechanism such as is found, for example, in laser printers and more particularly to a pulse width modulator configured for receiving digital data specifying grayscale values of pixels to be printed and, thereafter, converting the digital data to variable width pulses for driving the electrostatic printing mechanism.

2. Description of the Prior Art

Electrostatic printing mechanisms are popular in devices such as laser printers for reasons which include reliability and the ability to print at high resolutions using indelible toners. Digital information which is supplied to the electrostatic printing mechanism typically specifies grayscale intensity of pixels to be printed as an eight bit value corresponding to each pixel. In order to be used by the electrostatic printing mechanism, this digital information must be converted to a format appropriate for directly driving the laser or other such printing mechanism which is being used. The standard format uses a pulse width modulation scheme that converts eight bit pixel intensity values to predetermined pulse widths. In this regard, it should be appreciated that an eight bit value is capable of specifying 256 discrete values which may correspond to 256 different pulse widths, each of which represents a different grayscale level. It should also be appreciated that conversion of the grayscale digital pixel values to varying width pulses commands the need for relatively high data throughput in state-of-the-art systems and, of course, in future systems. For example, for video clock rate of 10 MHz, the conversion process would operate at approximately 2.5 GHz. This latter rate is significantly higher than what is presently available using pure digital technology.

One approach seen in the prior art for accomplishing the conversion process at an acceptable output rate uses analog circuitry to charge a capacitor while measuring the charge time of the capacitor. This approach is exemplified, for example, by a device designated as the AD9561 pulse width modulator manufactured by Analog Devices, Inc. While this device and similar devices that also utilize the approach are generally suited for their intended purpose, several limitations have come to light with regard to their operation. For example, in one limitation, the analog nature of the operation of these devices is relatively sensitive to noise. Another limitation resides in the tendency of these devices to be subject to drifting such that recalibration is required at frequent intervals in order to compensate for this drifting.

The present invention provides a highly advantageous pulse width modulator for use in electrostatic printing applications which eliminates the foregoing limitations by using a hybrid analog/digital approach.

SUMMARY OF THE INVENTION

As will be described in more detail hereinafter, an arrangement for producing a variable width pulse is disclosed for use in an electrostatic printing mechanism which is adapted to produce grayscale intensity of a pixel to be printed based on predetermined digital data. The variable width pulse is formed during a clock interval which is established by a clock signal such that the width of the pulse during the clock interval is based on the digital data and corresponds to a grayscale intensity of the pixel to be printed. The arrangement includes at least a first delay line having an input, an output and a plurality of cells serially connected therebetween such that a digital signal received by the input propagates from the input to the output through the cells. Each cell includes a cell output for indication of the present state of digital data contained in the cell. Input means then provides the clock signal, as the digital signal, to the input of the first delay line such that the clock signal propagates through the first delay line. Thereafter, processing means reads the cell output of a first one of the cells at a first position on the first delay line and then reads the cell output of a second one of the cells at a second, subsequent position on the first delay line to form the variable width pulse width having a width defined as the propagation time of the clock signal from the first position to the second position on the first delay line.

In one feature, a second delay line may be incorporated such that the arrangement is capable of outputting successive pulses having a width corresponding to the overall duration of the clock interval.

In another feature, a calibration arrangement is provided which automatically maintains the calibration of the first delay line. The calibration arrangement includes a second delay line having an input, an output and a configuration for producing delays substantially identical to those produced by the first delay line under identical operating conditions on a digital signal received by the input of the second delay line and, thereafter, propagating to the output of the second delay line. The input of the second delay line receives the clock signal as the digital signal such that the output of the second delay line is a delayed clock signal. Each cell of the first and second delay lines further includes a delay control input which establishes delay time provided by each cell. Discriminator means cooperates with the second delay line for comparing the delayed clock signal with the clock signal in a way which produces a difference signal. Thereafter, converter means receives the difference signal and produces a cell drive signal responsive to the difference signal which cell drive signal is coupled to the delay control input of each cell of the first and second delay lines in a way which reduces the difference signal such that the overall delay time of the first and second delay lines changes to more closely match the duration of one clock interval.

BRIEF DESCRIPTION OF THE DRAWINGS

The present invention may be understood by reference to the following detailed description taken in conjunction with the drawings briefly described below.

DETAILED DESCRIPTION OF THE INVENTION

Figure 1:
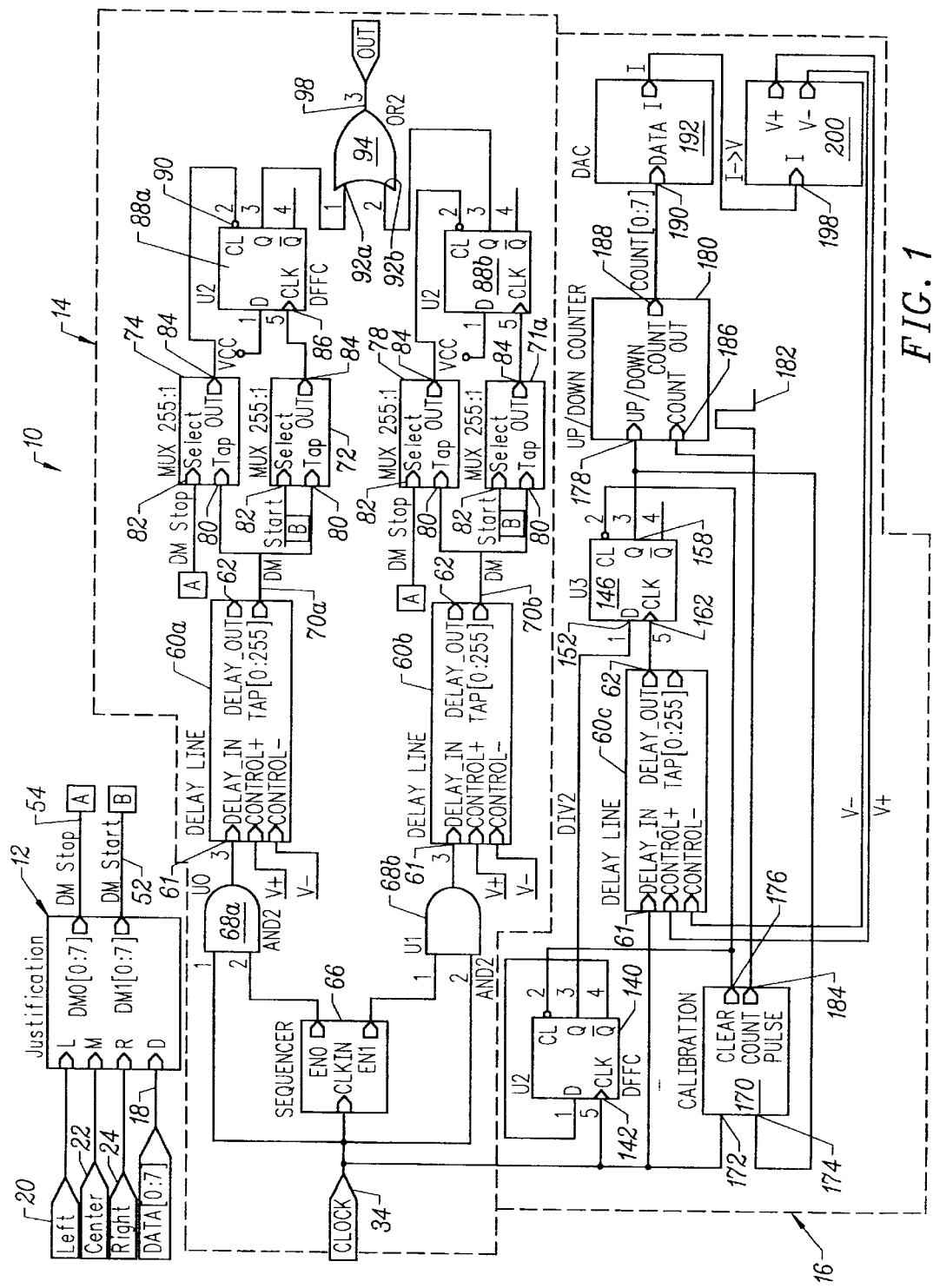
FIG. 1 is a schematic diagram illustrating one embodiment of the self calibrating pulse width modulator of the present invention for use in electrostatic printing applications.

Attention is immediately directed to FIG. 1 which illustrates a pulse width modulator arrangement manufactured in accordance with the present invention for use in electrostatic printing applications and generally indicated by the reference numeral 10. Arrangement 10 includes a processing section 12, a pulse generating section indicated within a dashed line 14 and a calibration section indicated within a dashed line 16. It is noted that like reference numbers have been applied to like components wherever possible throughout the various figures. Processing section 12 initially receives eight bit digital values corresponding to pixel grayscale levels on eight data lines 18, for example, from the frame buffer generated by a microprocessor (not shown). The processing section further includes data justification inputs 20, 22 and 24 which may also be provided by the aforementioned microprocessor and which correspond to left justification, centered and right justification, respectively. That is, the output of the overall pulse width modulator is in the form of a pulse having a predetermined width which is positioned within a clock interval, as described immediately hereinafter.

Still referring to FIG. 1, processing section 12 produces two eight bit positioning bytes in view of the justification information present on data justification inputs 20, 22 and 24 in combination with the eight bit digital value present on data lines 18. Thus, up to 256 different pulse widths, including a width of zero, can be specified positioned within one clock interval. Accordingly, each clock interval may be considered as being divided into 255 sub-intervals wherein the position of any pulse to be generated is identifiable by a start sub-interval and a stop sub-interval among the 255 possible sub-intervals. The corresponding start and stop position bytes are determined using Table 1 in which DATA represents the eight bit digital value received on lines 18.

TABLE 1

| JUSTIFICATION (Fig 1. inputs 20, 22, 24) | START POSITION BYTE | STOP POSITION BYTE |
| --- | --- | --- |
| Left | 0 | DATA |
| Centered | 128 - DATA/2 | 128 + DATA/2 |
| Right | 255 - DATA | 255 |

Figure 2:
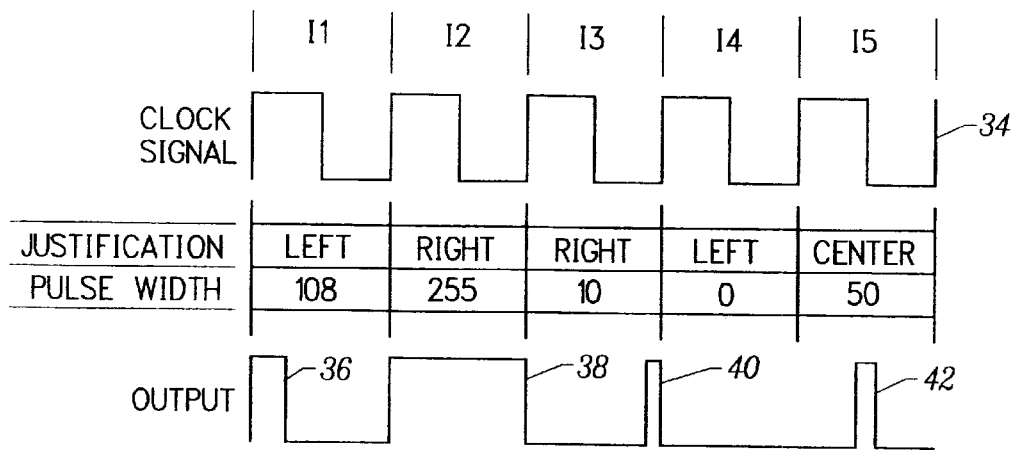
FIG. 2 is a waveform diagram illustrating various waveforms present in the circuitry of FIG. 1.

Referring to FIG. 2, specific examples are provided illustrating a desired output waveform 32 based on different justifications and eight bit digital values over five clock intervals which are indicated as I-1 through I-5 of clock signal 34. Specifically, in interval I1, a left justified pulse is specified having a width of 108 as indicated by the reference number 36; in interval I2, a right justified pulse is specified having a width of 255, as indicated by the reference number 38; in interval I3, a right justified pulse a specified having a width of 10, as indicated by the reference number 40; in interval I4, a left justified pulse is specified having a width of 0 (i.e., no corresponding output pulse is present in waveform 32); and in interval I5, a centered pulse is specified having a width of 50, as indicated by the reference number 42. In the instance of interval I2, it should be appreciated that the width of pulse 38 comprises the entire width of interval I2, as will be described at an appropriate point below.

Figure 3:
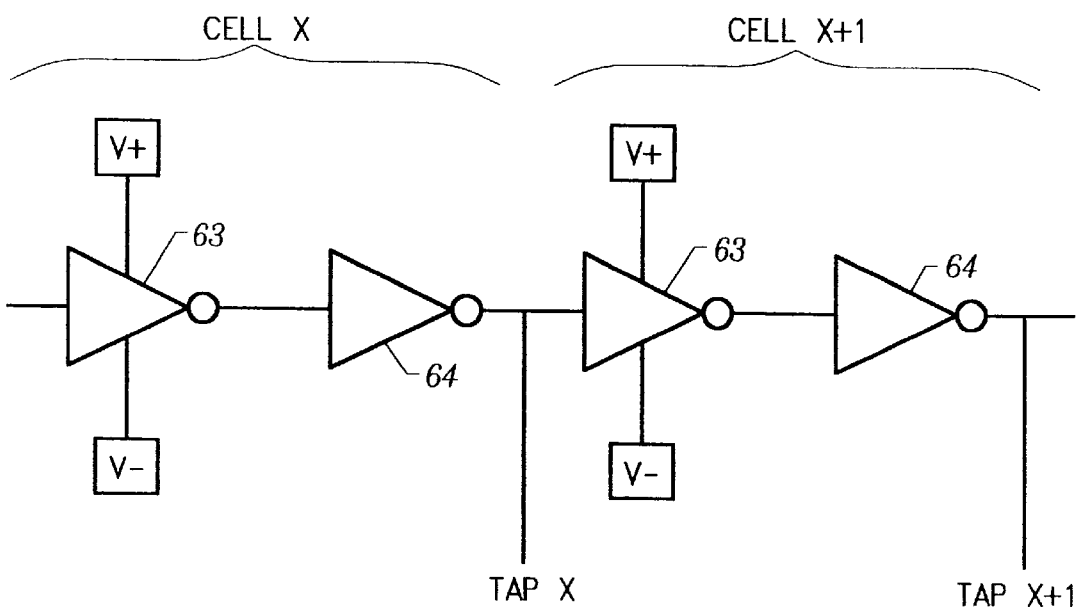
FIG. 3 is a block diagram illustrating the configuration of a single delay line cell.

Referring to FIGS. 1 and 3, after having determined the start and stop positioning bytes, justification section 12 outputs the start position byte on eight data lines 52 and the stop position byte on eight data lines 54 for use at appropriate points in pulse generating section 14, as indicated using terminal connections denoted by "A" and "B". The latter includes first and second identical delay lines indicated by the reference numbers 60a and 60b, each of which includes an input 61 and an output 62. It is of interest to note that these delay line outputs are not connected. The delay lines are made up of 256 individual cells. FIG. 3 illustrates two exemplary cells of the delay lines which are indicated as cells "X" and "X+1". Each cell includes a current starved inverter 63 followed by a high gain stage 64. The delay provided by each cell is varied by adjusting the current provided to the inverter through its V+ and V− inputs. Further details regarding the connection of the V+ and V− inputs will be provided at an appropriate point below in conjunction with a discussion regarding calibration section 16. The output of each delay cell is referred to herein as a "tap". In the present example, tap X is shown for cell X and tap X+1 is shown for cell X+1.

Clock pulses from previously described clock signal 34 are alternately provided to delay lines 60a and 60b by first passing the clock signal through a sequencer 66 and, thereafter, through a pair of AND gates 68a and 68b. In this manner, delay lines 60a and 60b are active during alternate clock cycles. For example, delay line 60a may be active during odd numbered clock intervals while delay line 60b may be active during even numbered clock intervals. In this regard, it should be appreciated that the configuration of arrangement 10 provides the capability of generating back to back full width clock interval output pulses. By contrast, a configuration using only one of delay lines 60 is generally effective, however, this capability is not present since the reset of the current clock cycle would interfere with the set of the next clock cycle. Delay line 60a includes 255 taps (i.e., one for each cell, as described above) which are collectively referred to by the reference number 70a. Similarly, delay line 60b includes 255 taps (i.e., one for each cell) which are collectively referred to by the reference number 70b. For each delay line, the cell taps are read by a pair of first and second multiplexers. Specifically, cell taps 70a of delay line 60a are read by a first multiplexer 72 and a second multiplexer 74 while cell taps 70b of delay line 60b are read by a third multiplexer 76 and a fourth multiplexer 78.

Still referring to FIG. 1, each multiplexer includes 255 tap inputs collectively indicated by reference number 80, an eight bit selection input 82 and an output 84. By reading the delay line taps, the multiplexers are able to detect a signal in any one cell of the 256 cells which make up their associated delay line based on an eight bit selection input provided to selection input 80. Upon detection of a signal in the specified cell, output 84 of the associated multiplexer becomes active. Selection inputs 82 of multiplexers 72 and 76 are connected with lines 52 from justification section 12 whereby to receive the start position byte while selection inputs 82 of multiplexers 74 and 78 are connected with lines 54 from justification section 12 whereby to receive the stop position byte.

With continuing reference to FIG. 1, output 84 of multiplexer 72 is connected to a clock input 86 of a first edge triggered D-type flip-flop 88a while output 84 of multiplexer 74 is connected to a clear input 90 of flip-flop 88a. A non-inverting output, Q, of flip-flop 88 is connected to one input 92a of an OR gate 94. Flip-flop 88b is similarly connected to the outputs of third and fourth multiplexers 76 and 78, respectively. The output of flip-flop 88b is, in turn, connected to another input 92b of OR gate 94. An output 98 of OR gate 94 provides the desired variable pulse width output by combining the alternating outputs of flip-flops 88a and 88b so as to produce waveform 34 of FIG. 2.

Figure 4:
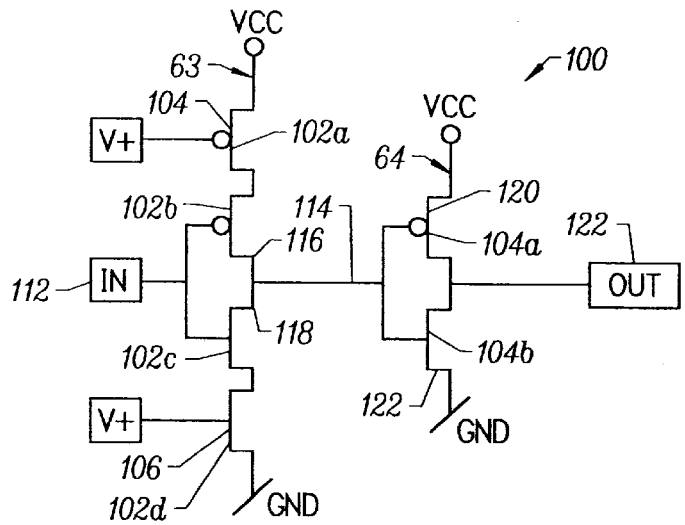
FIG. 4 is a schematic diagram illustrating details of the delay line cell of FIG. 3.

Attention is now directed to FIG. 4 which illustrates further details of one possible configuration for delay line cell "X" useful in all of the delay lines herein and generally indicated by the reference number 100. Previously mentioned current starved double inverter 63 is made up of four connected FET transistors 102a–d interconnected as shown. Inverted V+ is provided to gate 104 of FET 102a and V− is provided to gate 106 of FET 102d. Power (VCC) is connected to source 108 of FET 102a while drain 110 of FET 102d is connected to ground. An input 112 is connected to the gate of FETs 102c and inverted for connection to the gate of FET 102b. An output 114 is provided from the common connection point of drain 116 of FET 102b and source 118 of FET 102c. High gain stage 64 includes cascode connected FETs 104a and 104b wherein source 120 of FET 104a is connected to VCC and drain 122 of FET 104b is connected to ground. The gate of FET 104a is inverted and connected to output 114 of the current starved inverter while the gate of FET 104b is connected directly with output 114. An output of the high gain stage comprising the overall cell input is indicated by the reference number 122. The configuration of FIG. 4 is advantageous for reasons including simplicity, accurate control of timing, and small size. However, it should also be appreciated that the response of current starved stage 63 is quite nonlinear with respect to V+ and V−, as will be described in further detail.

Figure 5:
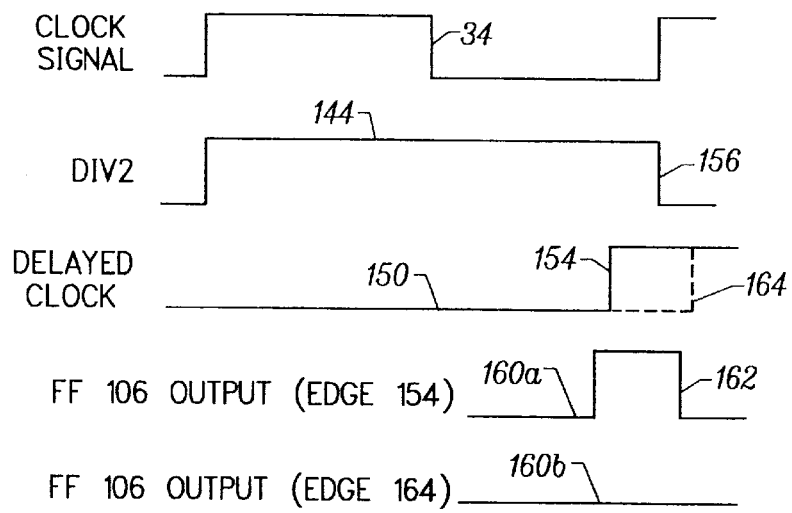
FIG. 5 is a waveform diagram showing waveforms which are present in the calibration section of the present invention.

Referring to FIGS. 1 and 5, having described pulse generation section 14, a discussion will now be provided with regard to the highly advantageous calibration section 16 of the present invention. Calibration section 16 includes an edge triggered D-type flip-flop 140 having a clock input 142 which receives clock signal 34. Flip-flop 140 is connected in a divide-by-two configuration which produces a DIV2 signal 144 at one-half the frequency of clock signal 34. The DIV2 signal is then received as the D input of another edge triggered D-type flip-flop 146. At the same time, a third delay line 60c receives clock signal 34 on its input 61. In this regard, it is important to note that this third delay line is identical to the first and second delay lines used in the pulse generation section. Therefore, delays produced by the third delay line should be identical to delays produced by the first and second delay lines particularly in view of the fact that all of the delay lines are subjected to the same ambient environment and power supply conditions. Ideally, the overall delay produced by each of the delay lines is intended to be exactly equivalent in time to one clock interval. To this end, delay line 60 serves as a calibration copy of the delay lines in the pulse generation section for use in generating previously described current starved inverter drive signals V+ and V−.

Still referring to FIGS. 1 and 5, in order to generate the drive signals, the input of clock signal 34 is fed into the input of calibration delay line 60c to produce a delayed clock signal 150 (FIG. 4) that is received by a clock input 152 of flip-flop 146. The latter serves as a discriminator which compares the arrival time of a leading edge 154 of delayed clock signal 150 with a trailing edge 156 of DIV2 signal 144. An output Q of flip-flop 146 indicated by the reference number 158 will generate one of two possible output waveforms based on the relationship between the delayed clock signal and the DIV2 signal. If leading edge 154 of the delayed clock signal arrives at flip-flop 146 prior to the trailing edge 156 of the DIV2 signal, output waveform 160a is produced including a pulse 162. Alternatively, if a leading edge 164 (indicated as a dashed line) of the delayed clock signal arrives at flip-flop 146 after the trailing edge 156 of the DIV2 signal, no output pulse is produced as illustrated by output waveform 160b. It should be mentioned, however, that the operation of the overall calibration section including flip-flops 140 and 146 is controlled by a calibration sequencer 170 which will be described immediately hereinafter.

Calibration sequencer 170 receives clock signal 34 on a first input 172 and receives output 158 of flip-flop 146 (i.e., the up/down count indication) on a second input 174. In the present embodiment, the calibration sequencer is configured for initiating a calibration cycle at predetermined intervals such as, for example, every tenth cycle of clock signal 34. A calibration cycle is initiated by outputting a clear pulse (not shown) from a clear output 176 of the calibration sequencer which resets both flip-flops 140 and 146. At the next rising edge of clock signal 34 the output of flip-flop 146 will either be high or low as discussed above. Output 158 of flip-flop 146 is also received by an up/down count input 178 of an up/down counter 180. If the up/down count input, is high, the counter will count up and, conversely, if the up/down count input is low, the counter will count down. Following initiation of calibration, calibration sequencer 170 outputs a pulse 182 from a count pulse output 184 to a count input 186 of the up/down counter. Thus, the value currently held by the up/down counter will be incremented or decremented by a count of one in view of the value on up/down count input 178. As will be described, the count value stored by the up/down counter represents an average value which dynamically converges on a value which corresponds to perfect calibration of delay line 60. It should be appreciated that the count value may be changed by more than one count or increment in accordance with the output of the sequencer. That is, the sequencer may output multiple pulses for reception by the counter based on considerations including convergence of the system on the optimum delay line calibration, as will be further described. Sequencer 170 essentially comprises a state machine the design of which may readily be implemented by one having ordinary skill in the art in view of this overall disclosure.

Still referring to FIG. 1, a count value stored by up/down counter 180 is transferred from a count output 188 to a data input 190 of a digital to analog converter (hereinafter DAC) 192. In the present example, up/down counter 180 is a 10-bit counter. It is a repple counter, and is therefore capable of counting up to a value of 1023 which has been found to give the sufficient response range. Other counters meeting these requirements are equally useful. The count value is converted by DAC 192 to an analog current, I, which is received by a current input 198 of a current to voltage converter 200 as will be described.

Figure 6:
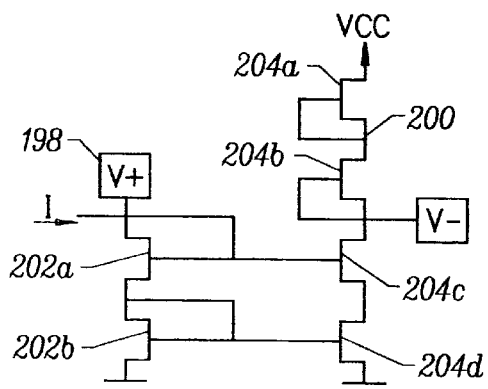
FIG. 6 is a schematic diagram illustrating a current to voltage converter which forms one part of the calibration section initially shown in FIG. 1.

Turning to FIG. 6 in conjunction with FIG. 1, as mentioned above, current starved delay lines exhibit a nonlinear behavior in delay versus the control voltages V+ and V−. This nonlinear behavior appears to include logarithmic characteristics. Current to voltage converter 200 serves to correct this nonlinearity in a highly advantageous way. Specifically, the current to voltage converter comprises a cascode stage arrangement which essentially provides an "inverse" transfer function that compensates for the nonlinear transfer function of the delay lines. The configuration of the current to voltage converter includes a first cascode section having FETs 202a and 202b connected as shown and a second cascode section having four FETs 204a–d connected as shown. Current I, generated by DAC 192, is provided to the gates of FETs 202a and 204c. Thereafter, the V+ drive voltage is provided as an output from the source of transistor 202a while the V− drive voltage is provided as an output from the gate of FET 204b. As a result of the use of the current to voltage converter in the illustrated configuration, an essentially linear change in delay time is observed with respect in change of the count value stored in up/down counter 180. It should be appreciated that, in the absence of the current to voltage converter, as described, the amount of change observed for an increment change in the value stored by the up/down counter is a function of the count value itself. Thus, in such a case, at a high count value a large change in delay is seen for a count change of one count or increment. Conversely, at a low count value a small change in delay is seen for an increment change in the count value.

It should be appreciated that the present invention is highly advantageous when contrasted with prior art arrangements described above that rely on capacitor charge times in producing variable width pulses for purposes of defining grayscale pixel levels within an overall electrostatic printing mechanism. As noted, prior art capacitor charge arrangements suffer from problems with regard to noise and drift. Moreover, the drift problem is resolved by the self calibration approach taken herein.

Although the invention is described herein with reference to the preferred embodiment, one skilled in the art will readily appreciate that other applications may be substituted for those set forth herein without departing from the spirit and scope of the present invention. Accordingly, the invention should only be limited by the claims included below.

What is claimed is:

1. In an electrostatic printing mechanism which is adapted to produce grayscale intensity of a pixel to be printed based on eight bits of digital data, an arrangement for producing a series of variable width pulses during clock intervals which are established by a clock signal such that the width of one variable width pulse produced during each clock interval is based on said digital data and corresponds to a grayscale intensity associated with said pixel, said arrangement comprising:

a) a first delay line arrangement and a second delay line arrangement including first and second delay lines, respectively, and each delay line including an input, an output and a plurality of 256 cells serially connected therebetween such that a digital signal received by the input of either delay line propagates from the input of the delay line to the output of the delay line through said cells, each cell including a cell output for indication of the present state of digital data contained in that cell;

b) input means for alternating the clock signal in one interval to the input of the first delay line and in the next interval to the input of the second delay line as said digital signal such that only one delay line arrangement is active at a time and the clock signal propagates through the first delay line during odd numbered clock intervals and through the second delay line in even numbered clock intervals; and c) processing means including
      i) control means configured for varying the locations of said first position and a second position along said first or second delay line such that the position and/or width of said pulse is variable within said clock interval,
      ii) first means for reading the cell output of a first one of said cells at a first position on said first or second delay line and, thereafter, for reading the cell output of a second one of said cells at a second, subsequent position on said first or second delay line and, thereafter, for forming said variable width pulse width having a width defined as the propagation time of said clock signal from said first position to said second position on the active one of the first or second delay line, said first and a subsequent second means each including first and second multiplexers configured for reading the cells of said first or second delay line, respectively, and having first and second inputs for specifying the cells corresponding to said first and second positions in a predetermined way such that the first multiplexer establishes a start time for said variable width pulse by outputting a first output signal when said clock signal reaches said first position and the second multiplexer establishes a stop time for said variable width pulse by outputting a second output signal when said clock signal reaches said second position,
      iii) a digital processing arrangement receiving said eight bits of digital data for use in specifying said first and second positions in said predetermined way by generating eight start bits for use by said first multiplexer of said first and second means specifying the cell at said first position and by generating eight stop bits for use by said second multiplexer of said first and second means specifying the cell at said second position, said digital processing arrangement further including first and second flip-flops each of which includes a flip-flop output and a flip flop input, said first flip-flop receiving said first output signal from said first multiplexer of said first means as one flip-flop clock signal and receiving said second output signal from said second multiplexer of said first means as one flip-flop reset signal and said second flip-flop receiving said first output signal from said first multiplexer of said second means as another flip-flop clock signal and receiving said second output signal from said second multiplexer of said second means as another flip-flop reset signal such that the first and second flip-flops alternately output one variable width pulse,
      iv) means for combining the alternate output of said variable width pulse from the first and second flip-flops to form said series of variable width pulses;

d) a calibration arrangement including
      i) a third delay line including an input, an output and a configuration having 256 cells for producing delays substantially identical to those produced by said first and second delay line under identical operating conditions on digital information received by the input of the third delay line and, thereafter, propagating to the output of the third delay line, said input of the third delay line receiving said clock signal as said digital information such that the output of said third delay line is a delayed clock signal, each cell of said first, second and third delay lines further including a delay control input which establishes delay time provided by each cell,
      ii) discriminator means cooperating with said third delay line for comparing said delayed clock signal with said clock signal in a way which produces a difference signal, and
      iii) converter means for receiving said difference signal and for producing a cell drive signal responsive to said difference signal which cell drive signal is coupled to the delay control input of each cell of the first, second and third delay lines in a way which reduces said difference signal such that the delay time of each cell of said first, second and third delay lines changes to more closely match the duration of one clock interval.

2. In an electrostatic printing mechanism which is adapted to produce grayscale intensity of a pixel to be printed based on predetermined digital data, an arrangement for producing a variable width pulse during a clock interval which is established by a clock signal such that the width of said pulse during the clock interval is based on said digital data and corresponds to a grayscale intensity associated with said pixel, said arrangement comprising:

a) at least a first delay line including an input, an output and a plurality of cells serially connected therebetween such that a digital signal received by said input propagates from the input to the output through said cells, each cell including a cell output for indication of the present state of digital data contained in the cell;

b) input means for providing the clock signal as said digital signal to the input of said first delay line such that the clock signal propagates through the first delay line; and c) processing means for reading the cell output of a first one of said cells at a first position on said first delay line and, thereafter, for reading the cell output of a second one of said cells at a second, subsequent position on said first delay line and, thereafter, for forming said variable width pulse width having a width defined as the propagation time of said clock signal from said first position to said second position on the first delay line.

3. The arrangement of claim 2 wherein said processing means is configured for varying the locations of said first and second positions along said first delay line such that the position and/or width of said pulse is variable within said clock interval.

4. The arrangement of claim 3 wherein said processing means includes first means at least for reading the output of the cell at said first position and second means at least for reading the output of the cell at said second position.

5. The arrangement of claim 4 wherein said processing means includes a digital processing arrangement for receiving said digital data and for determining said first and second positions based on said digital data.

6. The arrangement of claim 4 wherein said first and second means include first and second multiplexers having first and second inputs, respectively, for receiving first and second selection data which specifies the cells corresponding to said first and second positions such that the first multiplexer establishes a start time for said variable width pulse and the second multiplexer establishes a stop time for said variable width pulse.

7. The arrangement of claim 6 wherein said first multiplexer and said second multiplexer are configured for reading all of the cells of said delay line.

8. The arrangement of claim 6 wherein said processing means includes a digital processing arrangement for receiving said digital data and for determining said first and second selection data based on said digital data and for providing the first and second selection data to said first and second multiplexers.

9. The arrangement of claim 8 wherein said first delay line includes 256 cells and said digital data is provided as eight bits and wherein said digital processing arrangement provides said first selection data as eight start bits to said first multiplexer specifying the cell at said first position and provides said second selection data as eight stop bits to said second multiplexer specifying the cell at said second position.

10. The arrangement of claim 6 wherein said first multiplexer includes a first output and said second multiplexer includes a second output such that the first multiplexer provides a first output signal when said clock signal propagates to said first position and said second multiplexer provides a second output signal when said clock signal propagates to said second position.

11. The arrangement of claim 10 wherein said digital processing arrangement includes a flip-flop having a flip-flop output and flip-flop inputs for receiving said first output signal from said first multiplexer as a clock signal and receiving said second output signal from said second multiplexer as a reset signal such that said flip-flop output produces said variable width pulse.

12. The arrangement of claim 2 further comprising:

d) a calibration arrangement including
i) a second delay line including an input, an output and a configuration for producing delays substantially identical to those produced by said first delay line under identical operating conditions on a digital signal received by the input of the second delay line and, thereafter, propagating to the output of the second delay line, said input of the second delay line receiving said clock signal as said digital signal such that the output of said second delay line is a delayed clock signal, each cell of said first and second delay lines further including a delay control input which establishes delay time provided by each cell,
ii) discriminator means cooperating with said second delay line for comparing said delayed clock signal with said clock signal in a way which produces a difference signal, and
iii) converter means for receiving said difference signal and for producing a cell drive signal responsive to said difference signal which cell drive signal is coupled to the delay control input of each cell of the first and second delay lines in a way which reduces said difference signal such that the overall delay time of said first and second delay lines changes to more closely match the duration of one clock interval.

13. The arrangement of claim 12 wherein said discriminator means includes a divide by two counter which produces a one-half frequency clock signal and a flip-flop which receives said one-half frequency clock signal and said delayed clock signal to generate said difference signal.

14. The arrangement of claim 12 wherein said converter means includes an up/down counter which counts in response to said difference signal to produce a difference count and a digital to analog converter which receives said difference count and produces an analog current for use in generating said cell drive signal.

15. The arrangement of claim 14 wherein said converter means includes a current to voltage converter which receives said analog current and, thereafter, produces said cell drive signal as an analog voltage.

16. The arrangement of claim 12 wherein each cell of said delay lines includes a current starved stage having a first output and which defines said delay control input and wherein each cell further includes a high gain stage having a second output such that (i) the delay control input of the current starved stage receives the cell drive input to then provide said first output to the high gain stage and (ii) said second output of the high gain stage is the cell output of the cell.

17. The arrangement of claim 2 wherein each cell of said delay line includes a current starved stage having a first output and a high gain stage having a second output such that the current starved stage provides said first output to the high gain stage and said second output of the high gain stage is the cell output of the cell.

18. In an electrostatic printing mechanism which is adapted to produce grayscale intensity of a pixel to be printed based on predetermined digital data, an arrangement for producing a variable width pulse during a clock interval which is established by a clock signal such that the width of said pulse during the clock interval is based on said digital data and corresponds to a grayscale intensity associated with said pixel, said arrangement comprising:

a) a first delay line arrangement and a second delay line arrangement including first and second delay lines, respectively, and each delay line including an input, an output and a plurality of cells serially connected therebetween such that a digital signal received by the input of either delay line propagates from the input of the delay line to the output of the delay line through said cells, each cell including a cell output for indication of the present state of digital data contained in that cell;

b) input means for alternating the clock signal in one interval to the input of the first delay line and in the next interval to the input of the second delay line as said digital signal such that only one delay line arrangement is active at a time and the clock signal propagates through the first delay line during odd numbered clock intervals and through the second delay line in even numbered clock intervals; and c) processing means for reading the cell output of a first one of said cells at a first position on said first or second delay line and, thereafter, for reading the cell output of a second one of said cells at a second, subsequent position on said first or second delay line and, thereafter, for forming said variable width pulse width having a width defined as the propagation time of said clock signal from said first position to said second position on the active one of the first or second delay line.

19. The arrangement of claim 18 wherein said processing means is configured for varying the locations of said first and second positions along said first and second delay line such that the position and/or width of said pulse is variable within said clock interval.

20. The arrangement of claim 19 wherein said processing means includes first means for reading the output of the cell at said first position and said second position on said first delay line and second means for reading the output of the cell at said first position and said second position on said second delay line.

21. The arrangement of claim 20 wherein said processing means includes a digital processing arrangement for receiving said digital data and for determining said first and second positions based on said digital data.

22. The arrangement of claim 20 wherein said first and second means each include first and second multiplexers having first and second inputs, respectively, for receiving first and second selection data which specifies the cells corresponding to said first and second positions such that the first multiplexer establishes a start time for said variable width pulse and the second multiplexer establishes a stop time for said variable width pulse.

23. The arrangement of claim 22 wherein said first multiplexer and said second multiplexer associated with said first or second delay line are configured for reading all of the cells of said first and second delay line.

24. The arrangement of claim 22 wherein said processing means includes a digital processing arrangement for receiving said predetermined digital data and for determining said first and second selection data based on said predetermined digital data and then providing the first and second selection data to said first and second multiplexers associated with the first and second means.

25. The arrangement of claim 24 wherein said digital data is provided as eight bits and wherein said first second delay lines each include 256 cells and said digital processing arrangement provides said first selection data as eight start bits to said first multiplexer of said first and second means specifying the cell at said first position and provides said second selection data as eight stop bits to said second multiplexer of said first and second means specifying the cell at said second position.

26. The arrangement of claim 22 wherein said first multiplexer of said first and second means includes a first output and said second multiplexer of said first and second means includes a second output such that the first multiplexer provides a first output signal when said clock signal propagates to said first position and said second multiplexer provides a second output signal when said clock signal propagates to said second position.

27. The arrangement of claim 26 wherein said digital processing arrangement includes first and second flip-flops each of which includes a flip-flop output and a flip flop input, said first flip-flop receiving said first output signal from said first multiplexer of said first means as a clock signal and receiving said second output signal from said second multiplexer of said first means as a reset signal and said second flip-flop receiving said first output signal from said first multiplexer of said second means as a clock signal and receiving said second output signal from said second multiplexer of said second means as a reset signal such that the first and second flip-flops alternately output said variable width pulse.

28. The arrangement of claim 27 wherein said digital processing arrangement includes combining means for combining the alternate output of said variable width pulse from the first and second flip-flops.

29. In an electrostatic printing mechanism which is adapted to produce grayscale intensity of a pixel to be printed based on predetermined digital data having an pulse generating arrangement including at least a first delay line for producing a variable width pulse during a clock interval which is established by a clock signal such that the width of said pulse during the clock interval is based on said digital data and corresponds to a grayscale intensity associated with said pixel, said first delay line including at least one calibration drive input which varies delay produced thereby, a calibration arrangement acting in a way which stabilizes the output of said pulse generating arrangement, said calibration arrangement comprising:

a) a second delay line including an input, an output, a calibration drive input and a configuration for producing delays substantially identical to those produced by said first delay line under identical operating conditions on a digital signal received by the input of the second delay line and, thereafter, propagating to the output of the second delay line, said input of the second delay line receiving said clock signal as said digital signal such that the output of said second delay line is a delayed clock signal;

b) discriminator means cooperating with said second delay line for comparing said delayed clock signal with said clock signal in a way which produces a difference signal, and c) converter means for receiving said difference signal and for producing a calibration drive signal responsive to said difference signal which calibration drive signal is coupled to the calibration drive inputs of said first and second delay lines in a way which reduces said difference signal such that the delay produced by said first and second delay lines changes to more closely match the duration of one clock interval.

30. The calibration arrangement of claim 29 wherein said discriminator means includes a divide by two counter which produces a one-half frequency clock signal and a flip-flop which receives said one-half frequency clock signal and said delayed clock signal to generate said difference signal.

31. The calibration arrangement of claim 29 wherein said converter means includes an up/down counter which counts in response to said difference signal to produce a difference count and a digital to analog converter which receives said difference count and produces an analog current for use in generating said calibration drive signal.

32. The calibration arrangement of claim 31 wherein said converter means includes a current to voltage converter which receives said analog current and, thereafter, produces said calibration drive signal as an analog voltage.

* * * * *